United States Patent
Kanno et al.

(10) Patent No.: US 7,255,719 B2
(45) Date of Patent: Aug. 14, 2007

(54) WAFER ROTATION DEVICE AND EDGE FLAW INSPECTION APPARATAUS HAVING THE DEVICE

(75) Inventors: Takashi Kanno, Koshigaya (JP); Kimihiro Eguchi, Tokyo (JP)

(73) Assignee: Raytex Corporation, Tokyo (JP)

( * ) Notice: Subject to any disclaimer, the term of this patent is extended or adjusted under 35 U.S.C. 154(b) by 0 days.

(21) Appl. No.: 10/523,844

(22) PCT Filed: Aug. 8, 2003

(86) PCT No.: PCT/JP03/10166

§ 371 (c)(1),
(2), (4) Date: Feb. 7, 2005

(87) PCT Pub. No.: WO2004/015763

PCT Pub. Date: Feb. 19, 2004

(65) Prior Publication Data

US 2005/0237529 A1 Oct. 27, 2005

(30) Foreign Application Priority Data

Aug. 9, 2002 (JP) .............................. 2002-234077

(51) Int. Cl.
*H01L 21/00* (2006.01)
(52) U.S. Cl. .................................... 29/25.01
(58) Field of Classification Search ................ 29/25.01
See application file for complete search history.

(56) References Cited

U.S. PATENT DOCUMENTS 5,113,565 A * 5/1992 Cipolla et al. ............. 29/25.01

| 2001/0039168 | A1* | 11/2001 | Engdahl et al. ................ 451/41 |
| 2004/0070414 | A1* | 4/2004 | Tani ........................... 324/755 |
| 2005/0190259 | A1* | 9/2005 | Mitsuhashi et al. ........... 348/87 |

FOREIGN PATENT DOCUMENTS

| JP | 6-310485 | 11/1994 |
| JP | 7-297155 | 11/1995 |
| JP | 9-269298 | 10/1997 |
| JP | 10-294304 | 11/1998 |
| JP | 2000-164681 | 6/2000 |

OTHER PUBLICATIONS

International Search Report dated Nov. 11, 2003.

* cited by examiner

*Primary Examiner*—Michelle Estrada
(74) *Attorney, Agent, or Firm*—Carlson, Gaskey & Olds

(57) ABSTRACT

A wafer rotating device 1 is provided with at least three rollers 2 rotatably provided about axes arranged at parallel intervals and which rotate over the circumferential surface of a disk-shaped wafer 5, a rotation drive mechanism 3 that rotates and drives at least one of the rollers 2, an interval adjustment mechanism 4 capable of adjusting the dimensions of the intervals of the rollers 2, a load control device 6 that controls the load applied from the rollers 2 to the wafer 5 in the radial direction of the wafer 5 when the wafer 5 is clamped between rollers 2. As a result, a silicon wafer can be rotated without contacting the top and bottom surfaces of the silicon wafer.

7 Claims, 4 Drawing Sheets

WAFER ROTATION DEVICE AND EDGE FLAW INSPECTION APPARATAUS HAVING THE DEVICE

TECHNICAL FIELD

The present invention relates to a wafer rotating device that rotates a silicon wafer, semiconductor wafer or other part formed into the shape of a disk, and an edge flaw inspection device provided therewith.

BACKGROUND OF THE INVENTION

In the prior art, an example of an edge flaw inspection device for searching for edge flaws such as cracks, chips or polishing flaws in narrow, long edges such as the peripheral edges of silicon wafers is described in Japanese Patent No. 2999712.

This device is provided with a rotating table that horizontally rotates a silicon wafer by suctioning the bottom of the silicon wafer at a location near its center. Light is irradiated onto the edge of the silicon wafer being horizontally rotated by this rotating table and the light reflected by the edge is detected and analyzed to detect the type of edge defect or surface roughness and so forth.

However, since the rotating table of this device suctions the bottom of a silicon wafer, inspections cannot be carried out after the top and bottom of the silicon wafer have been polished, thereby enabling inspections to only be carried out before the top and bottom of the silicon wafer are polished.

Since edge defects have a high potential to expand or occur due to stress generated during polishing of the tops and bottoms of silicon wafers, it is preferable to inspect for edge defects and so forth after polishing the top and bottom of silicon wafers.

In consideration of these circumstances, an object of the present invention is to provide a wafer rotating device that enables silicon wafers to be rotated without contacting the top and bottom of the silicon wafer, and an edge flaw inspection device provided with this wafer rotating device.

SUMMARY OF THE INVENTION

A wafer rotating device of the present invention is provided with at least three rollers rotatably provided about axes arranged at parallel intervals and which rotate over the circumferential surface of a disk-shaped wafer, a rotation drive mechanism that rotates and drives at least one of the rollers, an interval adjustment mechanism capable of adjusting the dimensions of the intervals of the rollers, and a load control device that controls the load applied from the rollers to the wafer in the radial direction of the wafer when the wafer is clamped between the rollers.

According to this device, by operating the internal adjustment mechanism with a disk-shaped wafer arranged between the rollers, the interval between the rollers is adjusted resulting in the wafer being clamped between the rollers. Since at least three rollers are provided around the wafer, when the wafer is clamped by the rollers, the wafer is held in a state in which the position in the radial direction is fixed.

At this time, as a result of the load control mechanism being operated, since the load applied from the rollers to the wafer in the radial direction of the wafer is controlled, the interval between the rollers is adjusted so that the contact pressure between the rollers and wafer is constant even if there are variations in the outer diameter dimension of the wafer, thereby enabling variations in the outer diameter dimension of the wafer to be absorbed. When the rotation drive mechanism is operated while in this state, as a result of at least one of the rollers being driven and rotated, the wafer is rotated about its axial center due to friction between the roller peripheral surface and the circumferential surface of the wafer.

A load cell is provided in the interval adjustment mechanism that detects the load applied to the rollers along the direction of movement of the rollers, and the load control device may control the interval adjustment mechanism so that the load detected by the load cell is maintained constant.

In this case, as a result of the load applied to the rollers along the direction of movement of the rollers being detected by the load cell and operation of the load control apparatus, the interval adjustment mechanism is controlled so that the load is constant. Thus, the contact pressure between the wafer and rollers is maintained constant at all times even during rotation of the wafer, and stable rotation of the wafer can be achieved by transmitting a constant torque from the rollers to the wafer.

In addition to the rollers being rotatably provided around axes arranged roughly in the vertical direction, a flange section having a diameter larger than the circumferential surface is provided below the circumferential surface that clamps the wafer, and is composed of an inclined surface in which the upper surface of the flange section gradually becomes lower moving towards the outside in the radial direction.

In this case, as a result of allowing the rollers to approach to a suitable dimension in which the radial dimension of an inscribed circle of the roller peripheral surface is slightly larger than the diameter dimension of the wafer, the radius dimension of an inscribed circle of the roller flange section can be made to be smaller than the diameter dimension of the wafer. When a wafer is inserted between the rollers from above the rollers while in this state, the wafer is placed on the flange section of the roller in the state in which an interval is formed between the circumferential surface of the wafer and the peripheral surface of the roller.

Since the flange section is composed of an inclined surface that becomes lower moving towards the outside in the radial direction of the roller, the wafer is supported by the flange section only by the lower edge of its circumferential surface. When rollers are allowed to approach from this state, it contacts the peripheral edges of the rollers so that the wafer rides up onto the upper surfaces of the flange sections composed of inclined surfaces. Thus, a wafer can be easily delivered from a previous step to between the rollers and rotated simply by adjusting the interval between the rollers.

The interval between the other two rollers adjacent to the roller on both sides may be smaller than 180°. In the case a large flaw or notch has been formed on the circumferential surface of a wafer, when that flaw and so forth is arranged at the location of contact with one of the rollers, the contact pressure between the roller and wafer suddenly fluctuates and the wafer attempts to move in the direction of the roller. However, in this constitution, force acts in the direction that inhibits movement of the wafer as a result of rollers being arranged on both sides, thereby preventing the occurrence of misalignment during rotation.

A pair of rollers may also be arranged at three locations or more at intervals in the circumferential direction of a wafer. In this case, as a result of the circumferential surface of the wafer being pushed from roughly the same direction towards the inside in the radial direction by the pairs of rollers, even if large flaws or notches in the wafer coincide with one of the rollers, the wafer is held by the other roller so prevent fluctuation in the center position of the wafer.

An edge flaw inspection device of the present invention is provided with a wafer rotating device according to any of the rotating devices previously described, a light source that radiates light onto the circumferential surface of a wafer supported by the wafer rotating device, and a light detector that detects that light that has been radiated from the light source which is reflected on the circumferential surface of the wafer.

According to this edge flaw inspection device, a wafer is rotated while being supported only by its circumferential surface by the operation of the wafer rotating device. Thus, by radiating light from the light source while rotating the wafer, and then detecting the light reflected by the circumferential surface of the wafer with the light detector, edge flaws over the entire circumferential surface of the wafer can be inspected without contacting the wafer surface.

BEST MODE FOR CARRYING OUT THE INVENTION

The following provides an explanation of preferred embodiments of the present invention with reference to the drawings. However, the present invention is not limited to each of the following embodiments, and for example, the constituent features of these embodiments may be suitably combined or the constitution of each embodiment may be substituted with other known constitutions.

Figure 1:
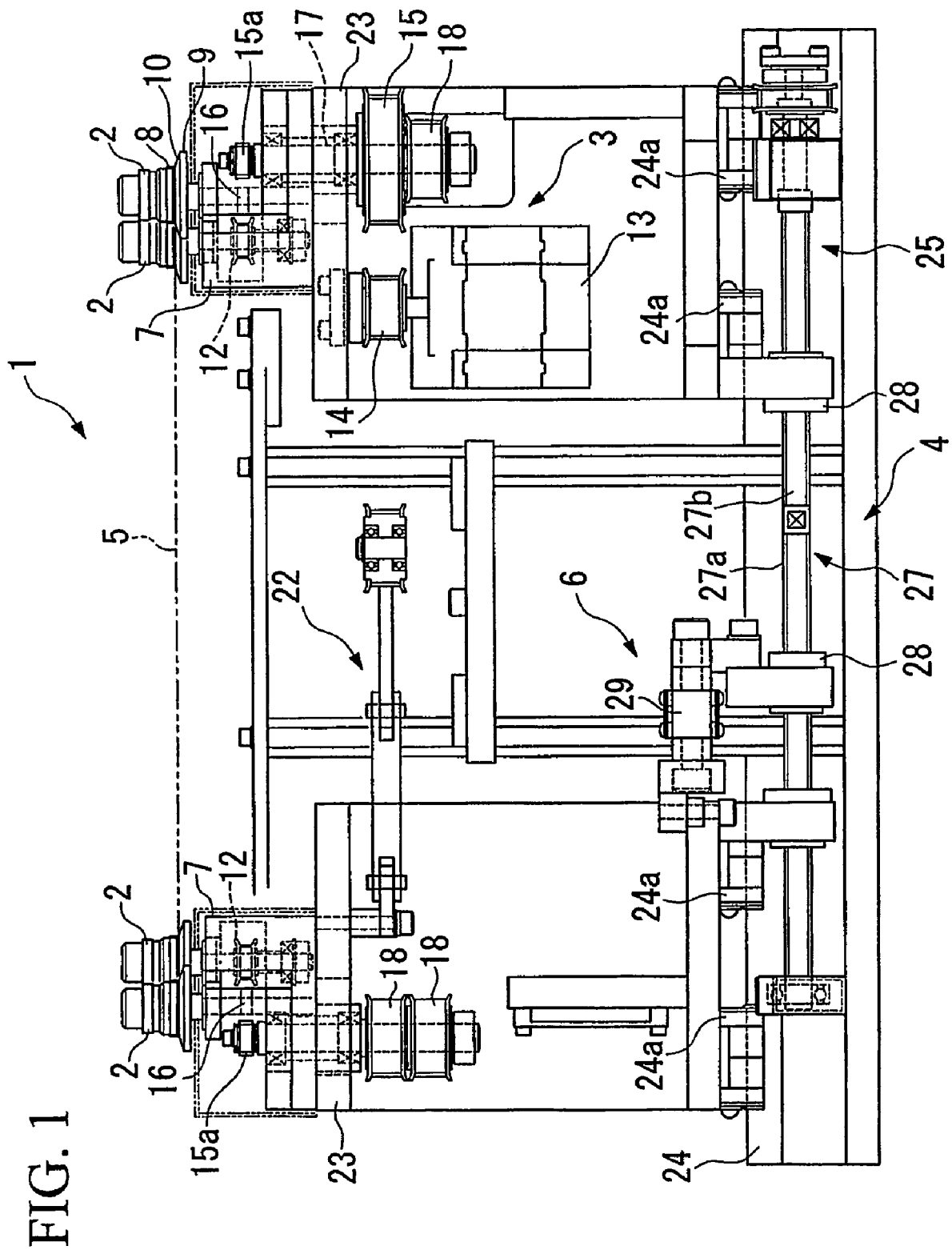
FIG. 1 is a front view showing a wafer rotating device as claimed in an embodiment of the present invention.
Figure 2:
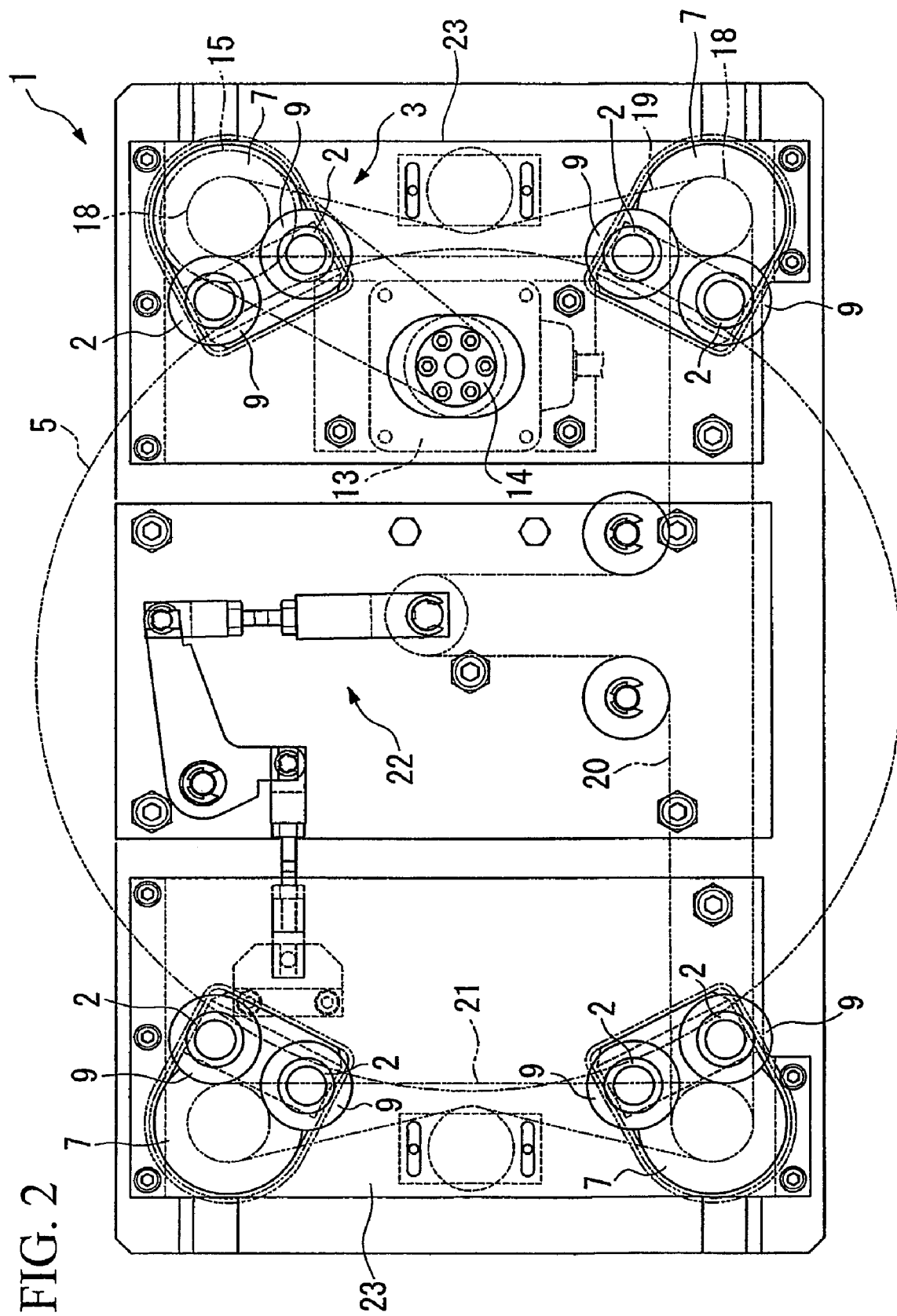
FIG. 2 is a plan view showing the wafer rotating device of FIG. 1.
Figure 3:
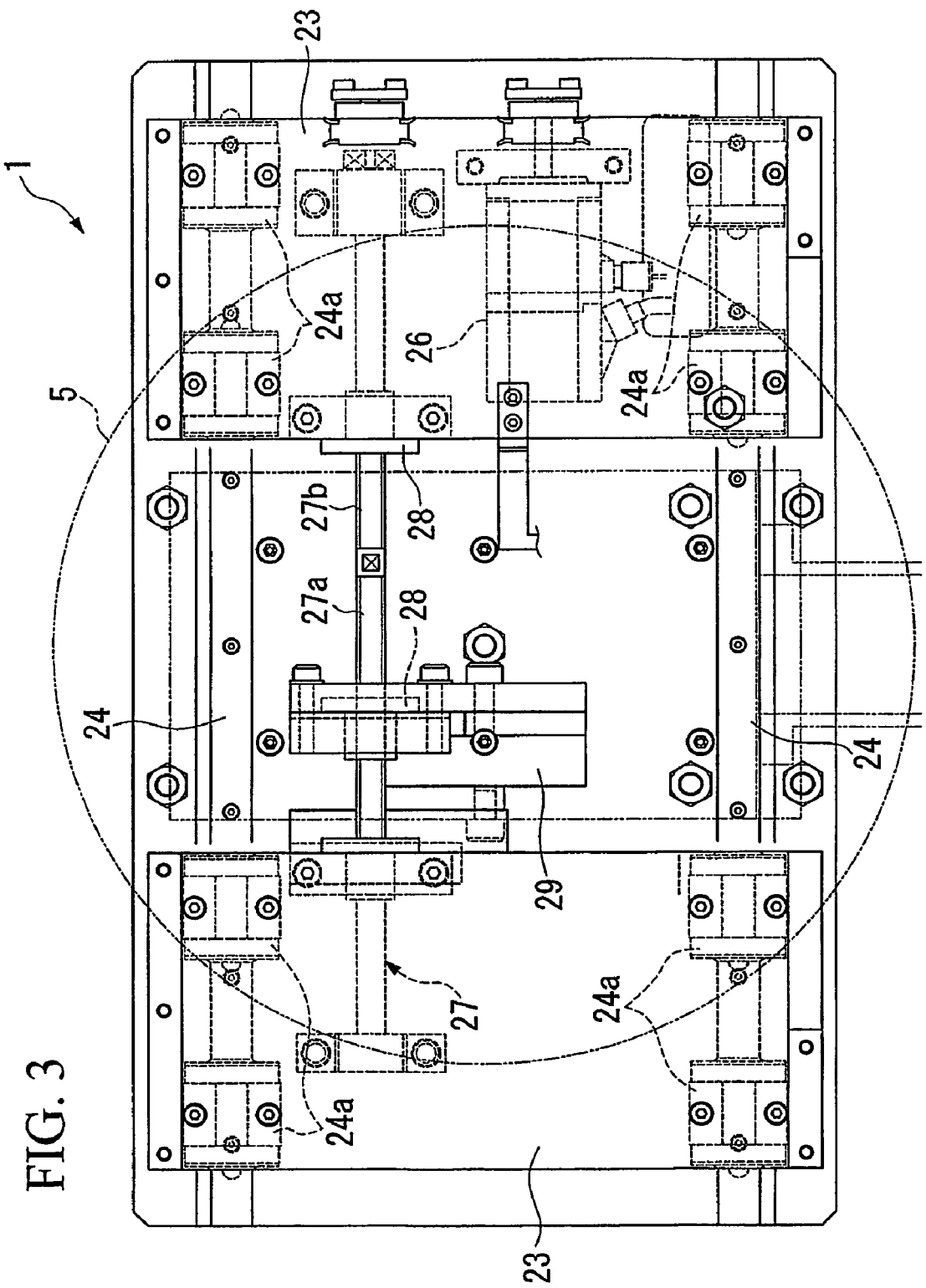
FIG. 3 is a plan view showing an interval adjustment mechanism of the wafer rotating device of FIG. 1.

As is shown in FIGS. 1 through 3, a wafer rotating device 1 of this embodiment is provided with eight rollers 2, a rotation drive mechanism 3 that rotates and drives these rollers 2, an interval adjustment mechanism 4 that adjusts the interval dimensions between these rollers 2, and a load control device 6 that controls the load applied from rollers 2 to a silicon wafer 5 clamped between rollers 2.

Figure 4:
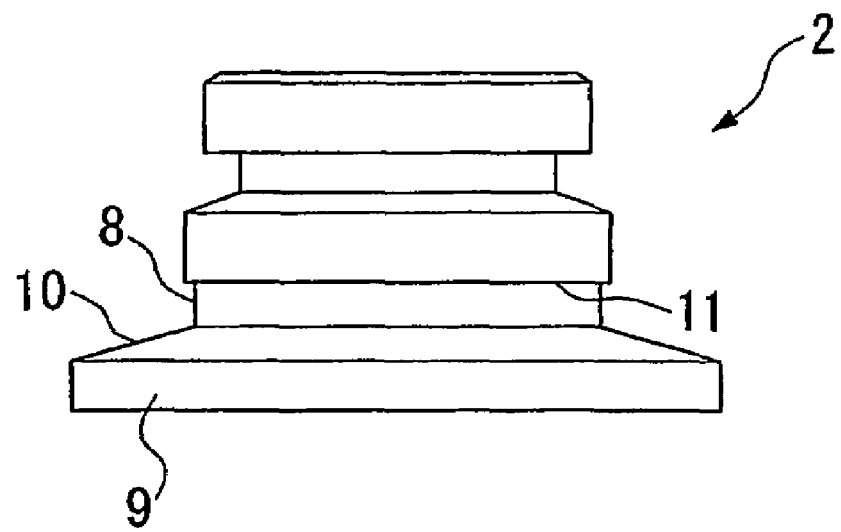
FIG. 4 is a front view showing the shape of a roller of the wafer rotating device of FIG. 1.

The eight rollers 2 are supported two each on four brackets 7. Each roller 2 is provided with a cylindrical surface 8 that contacts the circumferential surface of silicon wafer 5 a shown in FIG. 4, and a flange section 9 that is adjacent to the cylindrical surface 8 in one of the axial directions. Flange section 9 is formed over its entire circumference to of a larger diameter than the cylindrical surface 8. Flange section 9 is formed on an inclined surface 10 that gradually widens to the outside in the radial direction as the edge surface adjacent to the cylindrical surface 8 moves away from cylindrical surface 8 along the axial direction. A retaining section 11, which is formed to a diameter slightly larger than cylindrical surface 8 and which prevents silicon wafer 5 from coming off in the upward direction, is formed adjacent to cylindrical surface 8 in the other axial direction.

As shown in FIG. 1, rollers 2 are rotatably attached to the brackets 7 with the axis of rotation of each roller 2 in parallel. A pulley 12 is fastened to the end of each roller 2.

Brackets 7 are fastened to sliders to be described later so that the flange sections 9 of rollers 2 are arranged below the cylindrical surfaces 8 of rollers 2.

As shown in FIGS. 1 and 2, for example, the rotation drive mechanism 3 has a motor 13 and various pulleys and belts for transmitting the rotational torque of the motor 13. More specifically, the rotation drive mechanism 3 is provided with the motor 13, a drive pulley 14 fastened to the output shaft of motor 13, main pulleys 15 attached to each bracket 7 able to rotate about axes parallel to the axes of rotation of rollers 2, main drive pulleys 15a fastened to rotating shafts 17 of each main pulley 15 and a first belt 16 running between two rollers 2 and pulleys 12 provided on brackets 7, connecting pulleys 18 fastened to the rotating shafts 17 of each main pulley 15, and second belt 19 through fourth belt 21 running between the connecting pulleys 18 of the four brackets 7.

In the drawings, reference numeral 22 indicates a tensioner that adjusts the tension of the third belt 20 to remain constant by being displaced during movement of sliders 23 to be described later.

The interval adjustment mechanism 4 is provided with two pairs of sliders 23 to which are fastened two brackets 7 each, linear guides 24 that guide these sliders 23 in directions that cause them to approach and move away, and a direct-acting mechanism 25 that moves these sliders 23 along linear guides 24. In the drawings, reference numeral 24a indicates nuts that move over linear guides 24.

Brackets 7 are fastened to sliders 23 at a predetermined angle of inclination so that all eight rollers 2 simultaneously make contact with an inscribed circle that coincides with the external diameter dimension of the silicon wafer 5 being handled when the interval of two sliders 23 is adjusted to a predetermined position.

As shown in FIG. 3, for example, direct-acting mechanism 25 is provided with a motor 26, a ball screw 27 that is rotated and driven by motor 26, and nuts 28 that engage with the ball screw 27 and are attached to the sliders 23. Reverse threads are formed in both sides of ball screw 27 roughly about the center, and two each of nuts 28 for sliders 23 are engaged with each threaded section 27a and 27b.

When motor 26 is rotated in one direction, ball screw 27 is rotated in one direction corresponding to that rotation, and nuts 28 engaged with ball screw 27 are moved so as to approach or move away corresponding to that rotation. As a result, the interval between sliders 23 attached to nuts 28 is adjusted, and the interval dimension between rollers 2 fastened to sliders 23 is adjusted.

A load control device 6 has a load cell 29 arranged between one of the nuts 28 and sliders 23, and a control device (not shown) that controls the output of motor 26 of internal adjustment mechanism 4 corresponding to an output signal from the load cell 29. When silicon wafer 5 is clamped between rollers 2 and a load is applied to rollers 2, load cell 29 arranged between nuts 28 and sliders 23 detects the load applied to rollers 2 through brackets 7 and sliders 23. Thus, the interval between rollers 2 can be controlled so that the load applied to rollers 2 remains constant by controlling the output of motor 26 of interval adjustment mechanism 4 corresponding to the detected load.

The following provides an explanation of the operation of wafer rotating device 1 as claimed in the present embodiment composed in this manner.

When silicon wafer 5 is clamped between rollers 2, interval adjustment mechanism 4 is activated and the interval between rollers 2 is increased by increasing the interval between sliders 23. In the state in which the interval between cylindrical surfaces 8 of rollers 2 is larger than the outer diameter dimension of the silicon wafer 5 to be clamped, silicon wafer 5 that has been transported by a handling robot (not shown), for example, is inserted between rollers 2 from above rollers 2.

Figure 5:
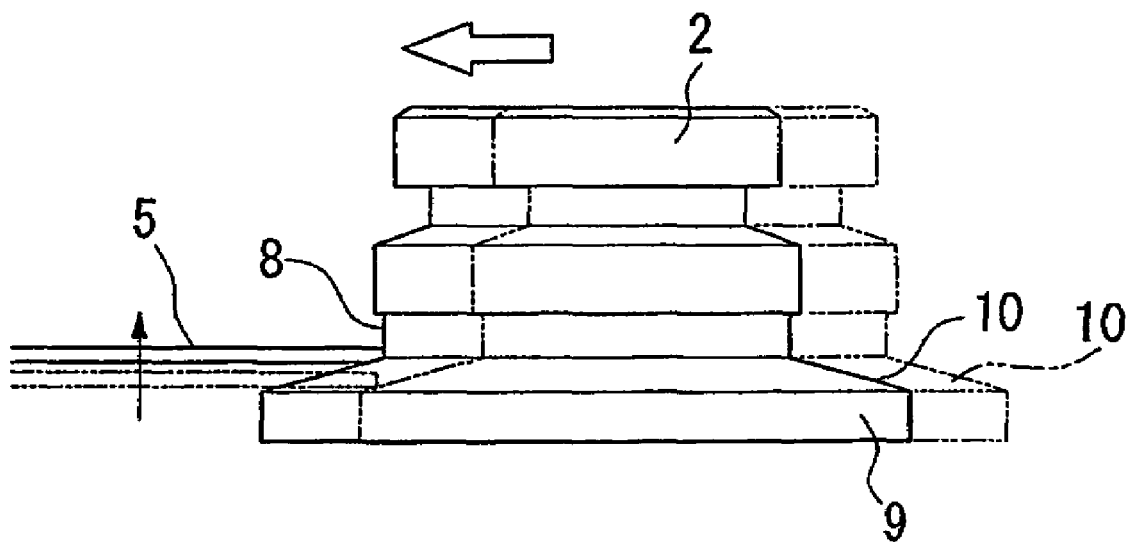
FIG. 5 is a front view showing the state of a wafer moving over the roller of FIG. 4.

Since flange sections 9 of a larger diameter than cylindrical surfaces 8 of rollers 2 are provided on the lower portions of rollers 2, silicon wafer 5 that has been inserted from above rollers 2 is delivered from the handling robot to wafer rotating device 1 so as to be placed on flange sections 9 as shown with the broken lines in FIG. 5. Since the upper surface of flange sections 9 is composed of an inclined surface 10, silicon wafer 5 is placed on rollers 2 by contacting the lower edge of its circumferential surface with inclined surfaces 10 of flange sections 9.

Next, when interval adjustment mechanism 4 is operated, sliders 23 are moved in the direction in which they approach each other, and the interval between rollers 2 decreases. Whereupon, silicon wafer 5 rises as indicated by the arrow in FIG. 5 by following inclined surfaces 10 formed in the upper surface of flange sections 9 of rollers 2, and is guided to the position where it is clamped by cylindrical surfaces 8 of rollers 2.

When sliders 23 further approach each other, the circumferential surface of silicon 5 contacts the cylindrical surfaces 8 of all rollers 2. When a contact load is generated between silicon wafer 5 and rollers 2, that load is detected by load cell 29, and the detected load is controlled by the control device so that it becomes a predetermined load.

While in this state, the rotational torque of motor 13 is transmitted to each roller 2 through pulleys 12, 14, 15, 15a and 18 and belts 16 and 19 through 21 as a result of operating motor 13 of rotation drive mechanism 3. Silicon wafer 5 is rotated and driven due to frictional force proportional to the contact load between rollers 2 and silicon wafer 5.

At this time, silicon wafer 5 is stably held in position by balancing gravity and frictional force at a position in the direction of height of any of cylindrical surfaces 8.

In this manner, according to wafer rotating device 1 as claimed in the present embodiment, silicon wafer 5 can be rotated without contacting the top and bottom surfaces of silicon wafer 5.

In addition, since the load generated between rollers 2 and silicon wafer 5 when the circumferential surface of silicon wafer 5 is pressed by rollers 2 is controlled instead of controlling the positions of rollers 2, even in the case in which there are variations in the outer diameter dimension of silicon wafer 5, silicon wafer 5 can be suitably clamped and rotated.

Moreover, since silicon wafer 5 is rotated by transmitting rotational torque from rollers 2 to the circumferential surface of silicon wafer 5, the task of indexing the center of rotation of silicon wafer 5 is unnecessary. Although transfer work was conventionally carried out consisting of indexing the amount of eccentricity and changing the suctioned location according to the rotating table by temporarily suctioning a silicon wafer to the rotating table and then rotating the rotating table, since this center of rotation indexing work and transfer work are no longer necessary, the number of steps can be significantly reduced.

Moreover, since pairs of rollers 2 are arranged at four locations at intervals in the circumferential direction of silicon wafer 5, even if a large flaw or V-shaped notch has been formed in the circumferential surface of silicon wafer 5, when that flaw and so forth makes contact with one of the rollers 2, a shift in the center of rotation of silicon wafer 5 can be prevented. Namely, in the case a flaw formed in the circumferential surface of silicon wafer 5 is located at a position that makes contact with a roller 2 due to rotation of silicon wafer 5, although silicon wafer 5 attempts to move towards the direction of that roller 2 since the contact load between that roller 2 and silicon wafer 5 fluctuates, silicon wafer 5 is held so as not to move by the other rollers 2 that support silicon wafer 5 at nearly the same location.

According to the wafer rotating device 1 in the present embodiment, since all eight rollers 2 that simultaneously contact the circumferential surface of silicon wafer 5 are rotated and driven by the operation of rotation drive mechanism 3, since it is difficult for slippage to occur between silicon wafer 5 and rollers 2, together with being able to improve the angular accuracy, silicon wafer 5 can be rotated at a comparatively high speed.

The edge flaw inspection device using the wafer rotating device 1 is provided with a light source that radiates parallel light from the outside in the radial direction of silicon wafer 5, and a light detector that detects reflected light on the circumferential surface of silicon wafer 5, outside wafer rotating device 1.

According to this edge flaw inspection device, since there is no contact made with the top and bottom surfaces of silicon wafer 5, edge flaws can be inspected even after polishing the top and bottom surfaces of silicon wafer 5.

In addition, since indexing of the center position of silicon wafers and transfer work are not necessary, and silicon wafers can be rotated at high speed, the inspection steps can be reduced thereby making it possible to improve yield.

Moreover, since slippage between the rollers and silicon wafer is reduced when rotating the silicon wafer at high speeds thereby making it possible to rotate the silicon wafer at a high degree of angular accuracy, the locations of edge flaws can be detected with high precision.

Although a constitution is employed in the present embodiment in which the rotational torque of motor 13 is transmitted to rollers 2 through pulleys 12, 14, 15, 15a and 18 as well as belts 16 and 19 through 21, other transmission mechanisms such as the use of gears may be employed instead. Although ball screw 27 is employed for the direct-acting mechanism, another arbitrary mechanism such as a cylinder may be employed instead.

Although pairs of rollers 2 are arranged at four locations, the number of brackets 7 fastened to one slider 23 may be made to be one, and pairs of rollers 2 may be arranged at three locations in the circumferential direction of silicon wafer 5. Moreover, if a large number of rollers 2 are used, instead of using in pairs, one roller each may be arranged at intervals.

INDUSTRIAL APPLICABILITY

According to the wafer rotating device of the present invention, a wafer can be rotated without suctioning the top and bottom surfaces of the wafer and without contacting the circumferential surface of the wafer. In addition, by controlling the contact load between the wafer and the rollers that make contact with its circumferential surface, since the wafer is clamped between the rollers, the wafer can be suitably clamped and allowed to rotate even if there are variations present in the diameter dimension of the wafer.

According to the edge flaw inspection device provided with this wafer rotating device, flaws formed in the circumferential surface can be inspected even after polishing the top and bottom surfaces of the wafer. Thus, flaws that expand or occur during wafer polishing can be detected by inspecting after that polishing.

The invention claimed is:

1. A wafer rotating device to rotate a disk-shaped wafer having a top surface, a bottom surface and a circumferential surface, the water rotating device comprising:
    at least three rollers rotatably provided about axes arranged at parallel intervals and disposed to clamp the wafer, wherein each of the rollers has a cylindrical surface;
    a rotation drive mechanism arranged to rotate and drive at least one of the rollers, wherein the cylindrical surfaces of the rollers contact only the circumferential surface of the wafer without contacting the top surface and the bottom surface of the wafer when the rotation drive mechanism is activated to rotate the wafer;
    a load cell disposed to detect a contact load between the cylindrical surfaces of the rollers and the circumferential surface of the wafer;
    an interval adjustment mechanism operatively connected to the rollers to adjust dimensions of the intervals of the rollers so that only the circumferential surface of the wafer is supported by a frictional force that is proportional to the contact load and so that the wafer is stabily held at a position in a direction of height of at least one of the cylindrical surfaces while balancing gravity and the frictional force; and
    a load control device that controls the interval adjustment mechanism so that the contact load detected by the load cell is maintained constant.

2. The wafer rotating device according to claim 1 wherein the rollers are rotatably provided around the axes which are arranged roughly in a vertical direction, and the rollers include a flange section, wherein the flange section has a diameter larger than the cylindrical surface of the rollers, and the flange section is provided below the cylindrical surface which clamps the wafer, and the flange section has an inclined surface in which an upper surface of the flange section gradually becomes lower moving towards an outside in a radial direction.

3. The wafer rotating device according to claim 1 wherein an angle between two of the rollers adjacent to one of the rollers and on both sides of the one of the rollers is smaller than 180°.

4. The wafer rotating device according to claim 3 wherein pairs of rollers are arranged at three or more locations at intervals in a circumferential direction of the wafer.

5. An edge flaw inspection device comprising:
    a wafer rotating device which rotates a disk-shaped wafer having a top surface, a bottom surface and a circumferential surface, the wafer rotating device including:
        at least three rollers rotatably provided about axes arranged at parallel intervals and disposed to clamp the wafer, wherein each of the rollers has a cylindrical surface,
        a rotation drive mechanism arranged to rotate and drive at least one of the rollers, wherein the cylindrical surfaces of the rollers contact only the circumferential surface of the wafer without contacting the top surface and the bottom surface of the wafer when the rotation drive mechanism is activated to rotate the wafer,
        a load cell disposed to detect a contact load between the cylindrical surfaces of the rollers and the circumferential surface of the wafer,
        an interval adjustment mechanism operatively connected to the rollers to adjust dimensions of the intervals of the rollers so that only the circumferential surface of the wafer is supported by a frictional force that is proportional to the contact load and so that the wafer is stabily held at a position in a direction of height of at least one of the cylindrical surfaces while balancing gravity and the frictional force,
        a load control device that controls the interval adjustment mechanism so that the contact load contact load detected by the load cell is maintained constant,
    a light source that radiates light onto the circumferential surface of the wafer supported by the wafer rotating device; and
    a light detector that detects the light that has been radiated from the light source which is reflected on the circumferential surface of the wafer.

6. The wafer rotating device according to claim 1 wherein the at least three rollers comprise eight rollers.

7. The wafer rotating device according to claim 6 further including four brackets, wherein two of the eight rollers are supported on each of the four brackets.

* * * * *

UNITED STATES PATENT AND TRADEMARK OFFICE
CERTIFICATE OF CORRECTION

PATENT NO. : 7,255,719 B2 Page 1 of 1
APPLICATION NO. : 10/523844
DATED : August 14, 2007
INVENTOR(S) : Kanno et al.

It is certified that error appears in the above-identified patent and that said Letters Patent is hereby corrected as shown below:

ON THE TITLE PAGE:

The title should read as follows:

Item (54) WAFER ROTATION DEVICE AND EDGE FLAW INSPECTION APPARATUS HAVING THE DEVICE Inventor Kanno's city should read as follows:

Item (75) Takashi Kanno, Koshigaya-shi (JP)

Signed and Sealed this

Fourth Day of December, 2007

JON W. DUDAS
*Director of the United States Patent and Trademark Office*